(12) United States Patent
Konno et al.

(10) Patent No.: US 10,160,636 B2
(45) Date of Patent: Dec. 25, 2018

(54) CERAMIC SUBSTRATE, BONDED BODY, MODULE, AND METHOD FOR MANUFACTURING CERAMIC SUBSTRATE

(71) Applicant: Mitsubishi Electric Corporation, Chiyoda-ku (JP)

(72) Inventors: Nobuaki Konno, Chiyoda-ku (JP); Yoshiaki Hirata, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/540,149

(22) PCT Filed: Oct. 30, 2015

(86) PCT No.: PCT/JP2015/080742
§ 371 (c)(1),
(2) Date: Jun. 27, 2017

(87) PCT Pub. No.: WO2016/117203
PCT Pub. Date: Jul. 28, 2016

(65) Prior Publication Data
US 2017/0362079 A1 Dec. 21, 2017

(30) Foreign Application Priority Data
Jan. 23, 2015 (JP) .................................. 2015-010995

(51) Int. Cl.
*B81B 7/00* (2006.01)
*B81B 7/02* (2006.01)
(Continued)

(52) U.S. Cl.
CPC .......... *B81B 7/0041* (2013.01); *B81B 7/0077* (2013.01); *B81B 7/02* (2013.01);
(Continued)

(58) Field of Classification Search
CPC . H01L 23/15; B81B 7/0041; B81B 2207/095; B81C 1/00293; B81C 2203/0109
See application file for complete search history.

(56) References Cited

U.S. PATENT DOCUMENTS 5,257,547 A * 11/1993 Boyer ................. G01L 19/0038
338/4
5,672,826 A * 9/1997 Suzuki ................. G01L 9/0054
73/721
(Continued)

FOREIGN PATENT DOCUMENTS

DE 197 16 521 A1 10/1998
JP 2004-55991 A 2/2004
(Continued)

OTHER PUBLICATIONS

International Search Report dated Dec. 22, 2015 in PCT/JP2015/080742 filed Oct. 30, 2015.
(Continued)

*Primary Examiner* — Allan R Wilson
(74) *Attorney, Agent, or Firm* — Oblon, McClelland, Maier & Neustadt, L.L.P.

(57) ABSTRACT

A ceramic substrate is mainly constituted of ceramic, and has a first main surface and a second main surface located opposite to the first main surface. A recessed portion recessed toward a first main surface side is formed in the second main surface. A wire portion extending from an outer peripheral surface of the ceramic substrate to inside of the recessed portion is formed, and a bottom portion located on the first main surface side in the recessed portion has a portion thinner than another portion of the ceramic substrate other than the bottom portion.

9 Claims, 7 Drawing Sheets

(51) Int. Cl.
    H01L 23/02    (2006.01)
    H01L 23/04    (2006.01)
    H01L 23/08    (2006.01)
    H01L 23/12    (2006.01)
    H01L 25/00    (2006.01)
    H05K 3/46     (2006.01)
    B81C 1/00     (2006.01)
    H01L 23/15    (2006.01)

(52) U.S. Cl.
    CPC ...... B81C 1/00158 (2013.01); B81C 1/00293 (2013.01); H01L 23/02 (2013.01); H01L 23/04 (2013.01); H01L 23/08 (2013.01); H01L 23/12 (2013.01); H01L 23/15 (2013.01); H01L 25/00 (2013.01); H05K 3/46 (2013.01); *B81B 2203/0315* (2013.01); *B81B 2207/012* (2013.01); *B81B 2207/092* (2013.01); *B81B 2207/095* (2013.01); *B81B 2207/096* (2013.01); *B81C 2201/0197* (2013.01); *B81C 2203/0109* (2013.01); *B81C 2203/0118* (2013.01); *B81C 2203/031* (2013.01); *B81C 2203/0785* (2013.01)

(56) References Cited

U.S. PATENT DOCUMENTS

| | | | |
|---|---|---|---|
| 2003/0020173 A1* | 1/2003 | Huff | B81B 7/0064 257/774 |
| 2004/0200291 A1 | 10/2004 | Dai et al. | |
| 2005/0229710 A1 | 10/2005 | O'Dowd et al. | |
| 2006/0115323 A1* | 6/2006 | Coppeta | A61K 9/0097 403/270 |
| 2010/0206075 A1* | 8/2010 | Oshio | G01C 19/56 73/511 |
| 2013/0008703 A1 | 1/2013 | Stahr et al. | |
| 2013/0320803 A1* | 12/2013 | Maeda | H02N 1/008 310/300 |
| 2014/0239979 A1* | 8/2014 | Wygant | B81B 7/007 324/658 |
| 2015/0211949 A1* | 7/2015 | Fujita | H01L 29/84 73/718 |
| 2017/0129774 A1* | 5/2017 | Chien | B81B 7/0041 |

FOREIGN PATENT DOCUMENTS

| | | |
|---|---|---|
| JP | 2007-59863 A | 3/2007 |
| JP | 2010-37165 A | 2/2010 |
| JP | 2010-67729 A | 3/2010 |
| JP | 2012-49298 A | 3/2012 |
| JP | 2013-30759 A | 2/2013 |
| JP | 2013-108876 A | 6/2013 |
| JP | 2013-524540 A | 6/2013 |

OTHER PUBLICATIONS

European Search Report issued in European Patent Application No. 15873892.7 dated Sep. 5, 2018.

* cited by examiner (a)

(b)

(c)

(a)

(b)

CERAMIC SUBSTRATE, BONDED BODY, MODULE, AND METHOD FOR MANUFACTURING CERAMIC SUBSTRATE

TECHNICAL FIELD

The present invention relates to a ceramic substrate, a bonded body, a module, and a method for manufacturing the ceramic substrate. In particular, the present invention relates to a ceramic substrate for forming a module in which a power device, a MEMS (Micro Electro Mechanical Systems) structural body, or the like is airtightly sealed, a bonded body including the ceramic substrate, a module in which a power device, a MEMS structural body or the like is airtightly sealed using the ceramic substrate, and a method for manufacturing the ceramic substrate.

BACKGROUND ART

When assembling a module in which a power device, a MEMS structural body, or the like using a wide band gap semiconductor such as gallium nitride (GaN) is airtightly sealed, a method of bonding a ceramic substrate to a substrate having the power device, the MEMS structural body, or the like formed thereon, and sealing such a device therein is adopted.

For example, Japanese Patent Laying-Open No. 2013-30759 describes a packaged device formed by bonding a device substrate having an electronic circuit, a MEMS, and other devices mounted thereon to a package material provided with a via wire and having a cavity. The above publication also describes that anodic bonding or the like can be adopted as a bonding method.

Further, Japanese Patent Laying-Open No. 2010-37165 describes an anodically bonded body formed by anodically bonding a low temperature co-fired ceramic substrate to a silicon substrate.

CITATION LIST

Patent Document

PTD 1: Japanese Patent Laying-Open No. 2013-30759
PTD 2: Japanese Patent Laying-Open No. 2010-37165

SUMMARY OF INVENTION

Technical Problem

However, in a conventional technique, a cavity in which a power device, a MEMS structural body, or the like is airtightly sealed has a small volume, and thus it has been difficult to check an airtight state. Specifically, the cavity has a volume of about 0.1 mm$^3$, and thus it has been difficult to check an airtight state using a helium (He) leak detector or the like.

The present invention has been made to solve the aforementioned problem. A main object of the present invention is to provide a ceramic substrate, a bonded body, a module, and a method for manufacturing the ceramic substrate which allow an airtight state in a module in which a power device, a MEMS structural body, or the like is airtightly sealed to be easily checked.

Solution to Problem

A ceramic substrate in accordance with the present invention is a ceramic substrate mainly constituted of ceramic and having a first main surface and a second main surface located opposite to the first main surface, wherein a recessed portion recessed toward a first main surface side is formed in the second main surface, a wire portion extending from an outer peripheral surface of the ceramic substrate to inside of the recessed portion is formed, and a bottom portion located on the first main surface side in the recessed portion has a portion thinner than another portion of the ceramic substrate other than the bottom portion.

Advantageous Effects of Invention

According to the present invention, since the bottom portion of the recessed portion including a portion of the first main surface has the portion thinner than the other portion of the ceramic substrate other than the bottom portion, the bottom portion of the recessed portion is easily deformable according to a pressure difference between a pressure inside the recessed portion when the recessed portion is airtightly sealed and a pressure outside the ceramic substrate. Therefore, there can be provided a ceramic substrate, a bonded body, a module, and a method for manufacturing the ceramic substrate which allow an airtight state in a module in which a power device, a MEMS structural body, or the like is airtightly sealed to be easily checked.

DESCRIPTION OF EMBODIMENTS

Figure 1:
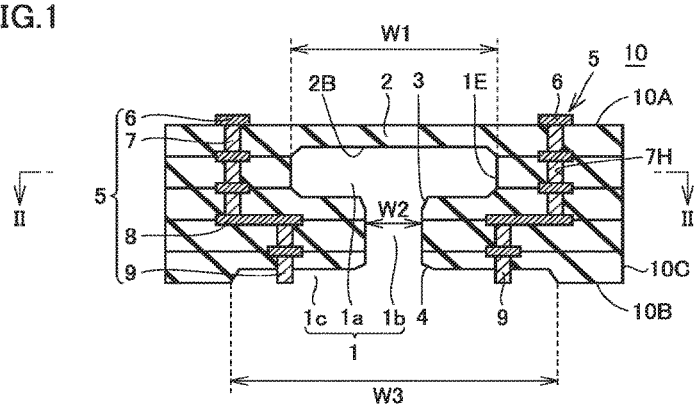
FIG. 1 is a cross sectional view for illustrating a ceramic substrate in accordance with a first embodiment.

Hereinafter, embodiments of the present invention will be described with reference to the drawings. It is to be noted that, in the drawings below, identical or corresponding parts will be designated by the same reference numerals, and the description thereof will not be repeated.

First Embodiment

A ceramic substrate 10 in accordance with a first embodiment will be described with reference to FIGS. 1 and 2. FIG. 1 is a cross sectional view of ceramic substrate 10 in accordance with the first embodiment. Although ceramic substrate 10 is mainly constituted of ceramic and may be constituted of any ceramic, ceramic substrate 10 in accordance with the first embodiment is a low temperature co-fired ceramic (LTCC) multilayer substrate mainly constituted of alumina ceramic. That is, ceramic substrate 10 is formed by bonding a plurality of ceramic base materials (for example, five ceramic base materials 11a, 11b, 11c, 11d, 11e) by low temperature co-firing (details thereof will be described later). Ceramic substrate 10 has a first main surface 10A and a second main surface 10B located opposite to first main surface 10A.

First main surface 10A faces the outside of a module 100 and a bonded body 200 in accordance with the first embodiment described later. On the other hand, second main surface 10B is a surface to be bonded to a device substrate 20 of module 100 or an opposing substrate 20 of bonded body 200. Preferably, second main surface 10B has a surface roughness Ra of less than or equal to 50 nm when ceramic substrate 10 is bonded to device substrate 20 or opposing substrate 20 by anodic bonding, and has a surface roughness Ra of less than or equal to 1 nm when ceramic substrate 10 is bonded to device substrate 20 or opposing substrate 20 by direct bonding or surface activated bonding (SAB). Further, when ceramic substrate 10 is bonded to device substrate 20 or opposing substrate 20 using an adhesive 24, second main surface 10B may have a surface roughness Ra of the order of micrometers.

In second main surface 10B, a recessed portion 1 recessed toward the first main surface 10A side is formed. That is, within recessed portion 1, there is formed a space having an open end on the second main surface 10B side, and a closed end closed by a bottom portion 2 on the first main surface 10A side. Recessed portion 1 may have a volume of 0.1 mm$^3$ as in the conventional technique described above, and is more than or equal to 0.0001 mm$^3$ and less than or equal to 100 mm$^3$, for example.

Referring to FIG. 1, recessed portion 1 has an H shape in a cross section perpendicular to first main surface 10A. That is, recessed portion 1 has a first recessed portion 1a which faces bottom portion 2 and has a width W1 in a direction along first main surface 10A, a second recessed portion 1b which is provided to be connected with first recessed portion 1a on the second main surface 10B side in a direction perpendicular to first main surface 10A and has a width W2 in the direction along first main surface 10A, and a third recessed portion 1c which is provided to be connected with second recessed portion 1b on the second main surface 10B side in the direction perpendicular to first main surface 10A and has a width W3 in the direction along first main surface 10A. Widths W1, W2, W3 satisfy the relation W1, W3≥W2. Width W1 of first recessed portion 1a in the direction along first main surface 10A is more than or equal to 0.1 mm and less than or equal to 10 mm, for example. Width W2 of second recessed portion 1b in the direction along first main surface 10A is more than or equal to 0.05 mm and less than or equal to 1 mm, for example. Width W3 of third recessed portion 1c in the direction along first main surface 10A is more than or equal to 0.1 mm and less than or equal to 10 mm, for example.

In other words, recessed portion 1 has a stepped portion 3 whose width in the direction along first main surface 10A narrows from the first main surface 10A side toward the second main surface 10B side in a direction intersecting first main surface 10A. Recessed portion 1 also has a stepped portion 4 whose width in the direction along first main surface 10A widens from the first main surface 10A side toward the second main surface 10B side, on a side closer to second main surface 10B than stepped portion 3.

Figure 2:
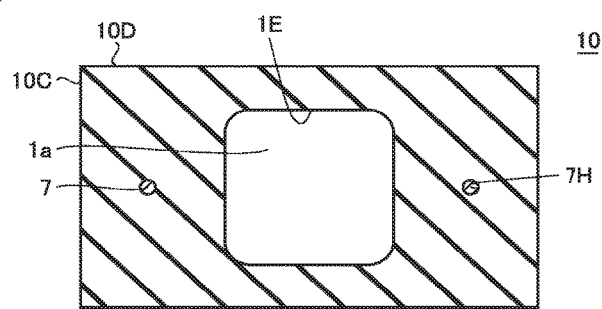
FIG. 2 is a cross sectional view seen from a line segment II-II in FIG. 1.

Referring to FIG. 2, cross sectional shapes of first recessed portion 1a, second recessed portion 1b, and third recessed portion 1c constituting recessed portion 1 in the direction along first main surface 10A may each be any shape, and are each a square shape with rounded corners, for example.

First recessed portion 1a faces an inner peripheral surface 2B of bottom portion 2. Second recessed portion 1b is formed at a position where it does not overlap with a passive element such as an internal electrode 23 formed on device substrate 20 described later, in the direction perpendicular to first main surface 10A.

Third recessed portion 1c is a portion of recessed portion 1 which is directly connected with second main surface 10B, and is provided such that an electronic component 21, internal electrode 23 electrically connected with electronic component 21, and the like which are mounted on device substrate 20 described later can be accommodated therein.

Bottom portion 2 is located on the first main surface 10A side in recessed portion 1. Bottom portion 2 has a portion of first main surface 10A, and inner peripheral surface 2B exposed within recessed portion 1. In other words, bottom portion 2 is formed in a region sandwiched between first main surface 10A and inner peripheral surface 2B in ceramic substrate 10. Bottom portion 2 has flexibility greater than that of another portion of ceramic substrate 10 other than bottom portion 2. In particular, in a portion of ceramic substrate 10 which faces recessed portion 1, bottom portion 2 has flexibility greater than that of the other portion other than bottom portion 2.

The material constituting bottom portion 2 is identical to the material constituting the other portion of ceramic substrate 10. The distance between inner peripheral surface 2B of recessed portion 1 and first main surface 10A (in other words, the thickness of bottom portion 2 in the direction perpendicular to first main surface 10A) is set to be partially thinner than the distance between an inner surface of recessed portion 1 in the other portion and an outer peripheral surface of ceramic substrate 10 located opposite to the inner surface (i.e., any of first main surface 10A, second main surface 10B, and side surfaces 10C, 10D: the same shall apply hereinafter). The thickness of bottom portion 2 in the direction perpendicular to first main surface 10A is more than or equal to 0.005 mm and less than or equal to 0.05 mm, for example. The width of bottom portion 2 in the direction along first main surface 10A is more than or equal to 0.1 mm and less than or equal to 10 mm, for example. That is, since bottom portion 2 is thinner than the other portion of ceramic substrate 10 other than bottom portion 2, bottom portion 2 is provided such that it can form a diaphragm which is deformable when a pressure difference between the pressure inside recessed portion 1 and the outside pressure is provided in a state where airtightness inside recessed portion 1 is maintained (i.e., in an airtight state in module 100).

It should be noted that the material constituting bottom portion 2 may be different from the material constituting the other portion of ceramic substrate 10. In this case, as the material constituting bottom portion 2, for example, a material having flexibility greater than that of the material constituting the other portion of ceramic substrate 10 is used. In this case, the main constituent material for bottom portion 2 is preferably silicon (Si). It should be noted that, when the material constituting bottom portion 2 is different from the material constituting the other portion of ceramic substrate 10, ceramic substrate 10 can be obtained, for example, by anodically bonding a substrate made of the material constituting bottom portion 2 to a ceramic substrate having a through hole (i.e., second recessed portion 1b and third recessed portion 1c), for example.

In ceramic substrate 10, a wire portion 5 extending from an outer peripheral surface (for example, first main surface 10A) to the inside of recessed portion 1 is formed. Wire portion 5 is a portion for electrically connecting electronic component 21 mounted on device substrate 20 described later with the outside of module 100 (i.e., electrically connecting an external electrode 6 with internal electrode 23), and has electrical conductivity. The material constituting wire portion 5 can be any material having electrical conductivity. When ceramic substrate 10 is an LTCC multilayer substrate, a metal material (gold (Au), platinum (Pt), silver (Ag), copper (Cu)) or the like having a low conductor resistance can be adopted. Further, the material constituting at least a bonding portion 9 of wire portion 5 is preferably a material having a high chemical resistance (i.e., having an etching rate lower than that of ceramic substrate 10 with respect to at least one of solutions which can etch the main constituent material for ceramic substrate 10) and having a high malleability, and is preferably Au. In addition, preferably, a material such as glass, which is to be etched with a solution capable of etching alumina ceramic serving as the main constituent material for ceramic substrate 10, is mixed into the material constituting bonding portion 9. Thus, a porous structure can be formed in bonding portion 9 by immersing bonding portion 9 in such an etching solution, and bonding portion 9 can be constituted to be flexibly deformable.

Wire portion 5 is formed to extend within ceramic substrate 10 in at least one of the direction intersecting first main surface 10A and the direction along first main surface 10A. Wire portion 5 has external electrode 6 formed on first main surface 10A other than a region included in bottom portion 2, through vias 7 formed to extend in the direction perpendicular to first main surface 10A, horizontal wires 8 formed to extend in the direction along first main surface 10A, and bonding portion 9 provided to protrude from the inside of ceramic substrate 10 to the inside of recessed portion 1.

Through vias 7 are constituted by embedding an electrically conductive member within first through holes 7H formed in the plurality of ceramic base materials constituting ceramic substrate 10 to extend in a direction in which these ceramic base materials are stacked.

Horizontal wires 8 are each formed to extend on at least one main surface (a surface perpendicular to the stacking direction described above) of each of the plurality of ceramic base materials. Each horizontal wire 8 is formed to connect its own through via 7 with a through via 7 formed in another one of the plurality of ceramic base materials which is adjacent thereto in the stacking direction described above (with a position where it overlaps with latter through via 7).

Bonding portion 9 has one end portion connected to horizontal wire 8, and the other end portion protruding into third recessed portion 1c, and is provided such that it can be connected to internal electrode 23 when ceramic substrate 10 is bonded to device substrate 20. As described above, bonding portion 9 preferably has a high malleability. Bonding portion 9 has a porous structure, for example, and thereby it is provided to have a low rigidity and to be deformable.

Figure 3:
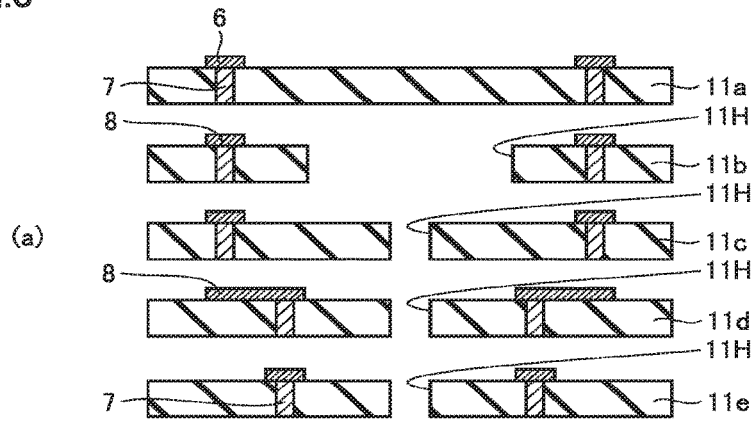
FIG. 3 is a cross sectional view for illustrating a method for manufacturing the ceramic substrate in accordance with the first embodiment.
Figure 3:
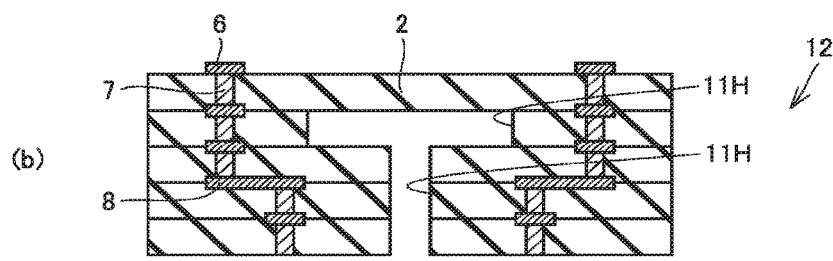
Figure 3:
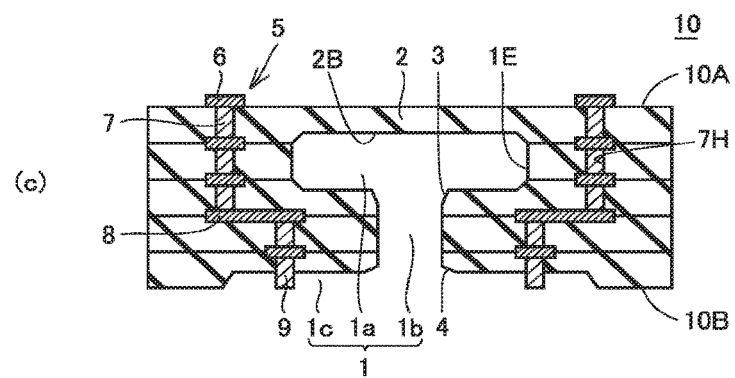

Next, a method for manufacturing the ceramic substrate in accordance with the first embodiment will be described with reference to FIG. 3. The method for manufacturing the ceramic substrate in accordance with the first embodiment includes a step (S10) of preparing the plurality of ceramic base materials (11a, 11b, 11c, 11d, 11e), a step (S20) of stacking and firing the plurality of ceramic base materials, and a step (S30) of forming recessed portion 1 in a stacked body 12 obtained by firing.

Referring to FIG. 3(a), first, the plurality of ceramic base materials are prepared (step (S10)). For example, five ceramic base materials 11a, 11b, 11c, 11d, 11e are prepared. Each ceramic base material 11a, 11b, 11c, 11d, 11e is a processed green sheet for an LTCC substrate. The green sheet for the LTCC substrate is fabricated by adding organic binder and solvent into a raw material prepared by mixing ceramic powder, glass, and other materials at a fixed compounding ratio to form a slurry, and applying the slurry on an organic film to have a fixed thickness and then drying the slurry. One green sheet for the LTCC substrate has a film thickness of several tens of micrometers to several hundreds of micrometers, for example.

It should be noted that, when ceramic substrate 10 is bonded to another member such as device substrate 20 made of a different constituent material by anodic bonding to manufacture module 100, it is preferable to use a material containing alkali metal ions such as Na ions and Li ions, as the glass to be mixed into the green sheet described above. Ceramic base materials 11a, 11b, 11c, 11d, 11e are each prepared by performing the following processing on the green sheet for the LTCC substrate.

Next, first through hole 7H is formed in each green sheet for the LTCC substrate. First through hole 7H is formed to connect two surfaces of each green sheet for the LTCC substrate which are opposite to each other. The shape of first through hole 7H on the surface can be any shape, and is a circular shape, for example. The width (hole diameter) of first through hole 7H on the surface can be determined based on the planar size of external electrode 6 or horizontal wire 8 on the surface and the change in size in the step (S20) of firing, and is several tens of micrometers to several hundreds of micrometers, for example, as with the film thickness of the green sheet for the LTCC substrate. First through hole 7H is formed by punching, laser, or the like, for example.

Next, the electrically conductive member is charged into first through hole 7H. The electrically conductive member can be charged by any method, and is charged by screen printing, for example. Thereby, through via 7 (including a portion to serve as bonding portion 9 in the step (S30) of forming recessed portion 1) is formed in each green sheet for the LTCC substrate. Further, external electrode 6 or horizontal wire 8 is formed as a film on one surface of each green sheet for the LTCC substrate in a direction in which through via 7 extends, so as to be connected with one end portion of through via 7 in the green sheet for the LTCC substrate. External electrode 6 and horizontal wire 8 can be formed as films by any film formation method, and is formed by sputtering, vapor deposition, or the like, for example. It should be noted that through via 7 and external electrode 6 or horizontal wire 8 may be formed together by screen printing or the like.

Thereby, ceramic base material 11a (i.e., a portion of the plurality of ceramic base materials 11a, 11b, 11c, 11d, 11e) having through via 7 and external electrode 6 (i.e., a first electrically conductive portion) formed therein is prepared. It should be noted that the thickness of ceramic base material 11a is set to be thicker than an etching amount in the later step (S30), that is, the depth of third recessed portion 1c in ceramic substrate 10 in the direction perpendicular to first main surface 10A.

Ceramic base materials 11b, 11c, 11d, 11e (i.e., remaining ceramic base materials of the plurality of ceramic base materials 11a, 11b, 11c, 11d, 11e) are each prepared by forming through via 7 and horizontal wire 8 (i.e., a second electrically conductive portion) by the above step, and thereafter forming a second through hole 11H in each green sheet for the LTCC substrate.

As with first through hole 7H, second through hole 11H is formed to connect the two surfaces of each green sheet for the LTCC substrate which are opposite to each other. The shape of second through hole 11H on the surface can be any shape, and is a circular shape, for example. Second through hole 11H is formed by punching, laser, or the like, for example, and may be formed together with first through hole 7H. In the green sheets for the LTCC substrate, respective second through holes 11H are formed to be connected with each other when the plurality of ceramic base materials are stacked in the step (S20) of firing.

Ceramic base material 11b is prepared by forming second through hole 11H, which will be first recessed portion 1a in ceramic substrate 10 by the step (S30) of forming recessed portion 1, in the green sheet for the LTCC substrate. Ceramic base materials 11c, 11d are each prepared by forming second through hole 11H, which will be second recessed portion 1b in ceramic substrate 10 by the step (S30) of forming recessed portion 1, in the green sheet for the LTCC substrate. Ceramic base material 11e is prepared by forming second through hole 11H, which will be second recessed portion 1b and third recessed portion 1c in ceramic substrate 10 by the step (S30) of forming recessed portion 1, in the green sheet for the LTCC substrate.

The width of second through hole 11H in ceramic base material 11b can be determined based on the size of bottom portion 2 in ceramic substrate 10 required to check the airtight state in module 100, and the etching amount in the step (S30) of forming recessed portion 1. The width of second through hole 11H on the above surface is more than or equal to 0.1 mm and less than or equal to 10 mm, for example.

The width of second through holes 11H in ceramic base materials 11c, 11d, 11e is determined such that second recessed portion 1b does not overlap with a passive element such as internal electrode 23 on device substrate 20, taking the etching amount in the step (S30) of forming recessed portion 1 into consideration. Further, the width of second through holes 11H in ceramic base materials 11c, 11d, 11e is determined to be narrower than the width of second through hole 11H in ceramic base material 11b.

Next, referring to FIG. 3(b), the plurality of ceramic base materials 11a, 11b, 11c, 11d, 11e are stacked and fired (step (S20)). First, the plurality of ceramic base materials 11a, 11b, 11c, 11d, 11e are stacked in the described order, such that through vias 7 and horizontal wires 8 formed therein are connected, and second through holes 11H formed therein are connected with each other.

Next, the plurality of ceramic base materials 11a, 11b, 11c, 11d, 11e stacked in order are simultaneously fired at a temperature of less than or equal to 1000° C. while applying a pressure thereto. Thereby, stacked body 12 formed by integrating the plurality of ceramic base materials 11a, 11b, 11c, 11d, 11e is fabricated. Stacked body 12 is an LTCC multilayer substrate. In stacked body 12, a T-shaped recessed shape is formed by connecting second through holes 11H in the plurality of ceramic base materials.

Next, referring to FIG. 3(c), recessed portion 1 is formed in stacked body 12 (step (S30)). Using a solution which can etch stacked body 12 as an LTCC multilayer substrate, wet etching is performed on a portion facing second through holes 11H (i.e., a surface exposed within second through holes 11H) in stacked body 12. A preferable etching solution is a solution which can etch alumina ceramic serving as the main constituent material for stacked body 12 and does not etch wire portion 5 formed in stacked body 12 (i.e., the rate of etching wire portion 5 is sufficiently lower than the rate of etching alumina ceramic), and is a hydrofluoric acid-based solution, for example.

The etching amount on this occasion can be controlled by etching time, and thereby, the thickness of bottom portion 2 in the direction perpendicular to first main surface 10A can be controlled. It should be noted that, since the thickness of ceramic base material 11a is set to be thicker than the depth of third recessed portion 1c in the direction perpendicular to first main surface 10A as described above, the etching in this step (S30) can form third recessed portion 1c in which electronic component 21 mounted on device substrate 20 can be accommodated, and can control the thickness of bottom portion 2 described above.

Thereby, in stacked body 12, first recessed portion 1a and bottom portion 2 are formed by etching a portion facing second through hole 11H formed in ceramic base material 11b (i.e., ceramic base materials 11a, 11b, 11c), second recessed portion 1b is formed by etching a portion facing second through holes 11H formed in ceramic base materials 11c, 11d (i.e., ceramic base materials 11c, 11d, 11e), and second recessed portion 1b and third recessed portion 1c are formed by etching a portion facing second through hole 11H formed in ceramic base material 11e (i.e., ceramic base material 11e). At the same time, stepped portions 3, 4 are formed. That is, the step (S30) of forming recessed portion 1 is a step of controlling the thickness of bottom portion 2 in the direction perpendicular to first main surface 10A and the width of bottom portion 2 in the direction along first main surface 10A.

It should be noted that, in this step (S30), alumina ceramic around through via 7 formed in ceramic base material 11e in the previous step (S10) is etched to form bonding portion 9 in which through via 7 is partially exposed. Further, when a material such as glass, which is to be etched with a solution capable of etching alumina ceramic, is mixed into the material constituting bonding portion 9 as described above, bonding portion 9 having a porous structure can be formed.

In this manner, ceramic substrate 10 in accordance with the first embodiment can be obtained.

It should be noted that the shape of recessed portion 1 may be any shape, and does not have to have stepped portions 3, 4. That is, recessed portion 1 may be provided such that its width in the direction along first main surface 10A is constant in the direction perpendicular to first main surface 10A. Also in this manner, the same configuration as that of ceramic substrate 10 in accordance with the first embodiment can be provided. Further, although second recessed portion 1b is formed to extend linearly along the direction perpendicular to first main surface 10A, the shape of second recessed portion 1b is not limited thereto, and second recessed portion 1b may be formed such that, for example, a plurality of second recessed portions 1b are formed and snake through ceramic substrate 10, as long as they connect first recessed portion 1a and third recessed portion 1c.

It should be noted that polishing may be performed on ceramic base material 11a, 11e, stacked body 12, or ceramic substrate 10 after the step (S10), the step (S20), or the step (S30). As described above, since the optimal range of surface roughness Ra of second main surface 10B of ceramic substrate 10 differs depending on the method of bonding ceramic substrate 10 to the device substrate or the opposing substrate, it is preferable to perform polishing on second main surface 10B in accordance therewith.

Further, polishing may be performed on first main surface 10A after the step (S20) or the step (S30), for example. Thereby, the thickness of bottom portion 2 in the direction perpendicular to first main surface 10A can be controlled not only by etching but also by polishing. External electrode 6 may be formed after a step of performing polishing on first main surface 10A. Since external electrode 6 is formed after the step (S20) of firing in this case, external electrode 6 can be formed by any film formation method such as sputtering, vapor deposition, plating, or the like, in addition to screen printing.

It should be noted that, from the viewpoint of securing high airtightness inside module 100, external electrode 6 is preferably formed as a dense film, and is preferably formed as a film by sputtering. In this case, sputtering is preferably performed with stacked body 12 or ceramic substrate 10 being rotated and revolved.

It should be noted that, from the viewpoint of securing high uniformity in the thickness of bottom portion 2 in the direction perpendicular to first main surface 10A, polishing on first main surface 10A is preferably performed prior to the step (S30).

Although the method for manufacturing ceramic substrate 10 in accordance with the first embodiment includes the step (S30) of forming recessed portion 1 by performing etching on stacked body 12, the method is not limited thereto. Recessed portion 1 may be formed by preparing a plurality of ceramic base materials having first recessed portion 1a, second recessed portion 1b, and third recessed portion 1c respectively formed therein in the step (S10) of preparing the plurality of ceramic base materials, and firing these ceramic base materials in the step (S20) of firing. In this case, the thickness of bottom portion 2 in the direction perpendicular to first main surface 10A can be controlled by performing a step of polishing ceramic base material 11a, 11e, or ceramic substrate 10 (stacked body 12), for example.

Further, in the step (S10) of preparing, ceramic base material 11a may be prepared such that, after it is fired, its thickness in the direction perpendicular to first main surface 10A becomes equal to the thickness of bottom portion 2 in the direction perpendicular to first main surface 10A. In this case, the method for manufacturing ceramic substrate 10 does not have to include a step of adjusting the thickness of bottom portion 2 described above, such as the step (S30) of forming recessed portion 1, after the step (S20) of firing.

It should be noted that, although a through hole is not formed only in ceramic base material 11a, through holes do not have to be formed in the plurality of ceramic base materials 11a, 11b. For example, ceramic base material 11b may have a portion which is dented enough to allow a through hole to be formed by the etching in the step (S30) of forming recessed portion 1.

Further, although recessed portion 1 has an H shape in the cross section perpendicular to first main surface 10A (i.e., stepped portions 3, 4 are formed) in ceramic substrate 10 in accordance with the first embodiment, the shape of recessed portion 1 is not limited thereto. Stepped portions 3, 4 do not have to be formed when a passive element is not formed on device substrate 20 described later, or when there is no need to control the thickness of bottom portion 2 by the etching in the step (S30) of forming recessed portion 1.

Figure 4:
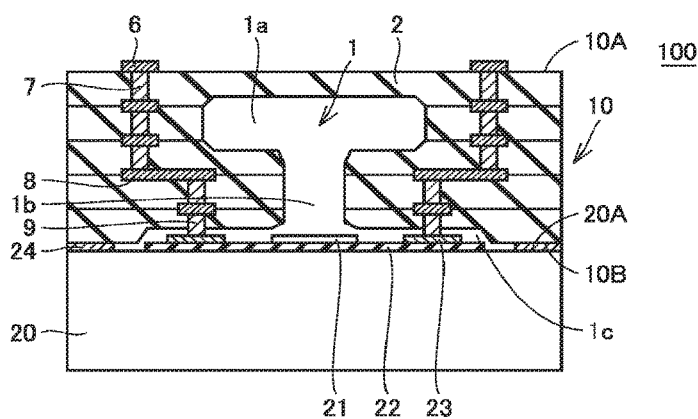
FIG. 4 is a cross sectional view for illustrating a module in accordance with the first embodiment.

Next, module 100 in accordance with the first embodiment will be described with reference to FIG. 4. Module 100 includes ceramic substrate 10 in accordance with the first embodiment described above, and device substrate 20.

Although the material constituting device substrate 20 may be any material, it is preferably selected in accordance with the method of bonding ceramic substrate 10 and device substrate 20. For example, when the bonding method is anodic bonding, the material constituting device substrate 20 is preferably Si. In particular, when electronic component 21 is a MEMS structural body, device substrate 20 may be a SOI (Silicon on Insulator) wafer. When an adhesive is used, the material constituting device substrate 20 should be a material which can be bonded with the adhesive. It should be noted that, when the bonding method is direct bonding or surface activated bonding, the material constituting device substrate 20 may be any material, and no material is specifically selected.

Device substrate 20 has a third main surface 20A, and includes electronic component 21 mounted on third main surface 20A. Specifically, an insulating film 22 is formed on third main surface 20A, and electronic component 21 is fixed on insulating film 22.

Electronic component 21 may be any device, and is a power device, a MEMS structural body, or the like using a wide band gap semiconductor such as GaN, for example.

Insulating film 22 may be any film having electrical insulating properties, and is preferably an oxide film.

On insulating film 22, internal electrode 23 electrically connected with electronic component 21 is formed. Internal electrode 23 is provided such that it can be bonded to bonding portion 9. The material constituting internal electrode 23 may be any material having electrical conductivity, and is preferably Au, aluminum (Al), Al—Si, Al—Cu, or the like. Internal electrode 23 can be formed by any method, and is formed as a film by sputtering, vapor deposition, or the like, for example. When internal electrode 23 is formed as a film by sputtering or the like, internal electrode 23 preferably contains chromium (Cr), nickel (Ni), titanium (Ti), tungsten (W)—Si, or the like as an adhesion layer or an intermediate layer.

Portions of insulating film 22 and internal electrode 23 other than portions thereof to be connected to bonding portion 9 are covered with a protective film (not shown). The protective film is an oxide film or a nitride film, for example.

In ceramic substrate 10 and device substrate 20 of module 100, second main surface 10B and third main surface 20A are bonded such that electronic component 21, insulating film 22, and internal electrode 23 are accommodated within recessed portion 1.

Electronic component 21, insulating film 22, and internal electrode 23 are airtightly sealed within recessed portion 1. On this occasion, preferably, a pressure difference is provided between the pressure inside recessed portion 1 in the state where airtightness inside recessed portion 1 is maintained and the pressure under an environment in which module 100 is arranged when it is actually used (for example, atmospheric pressure). In module 100, in the state where airtightness of recessed portion 1 is maintained, bottom portion 2 provided on ceramic substrate 10 deflects due to the pressure difference. For example, when the pressure inside recessed portion 1 is lower than the pressure under the environment, bottom portion 2 is dented with respect to first main surface 10A toward the second main surface 10B side (deflection of bottom portion 2 is not shown in FIG. 4).

Figure 5:
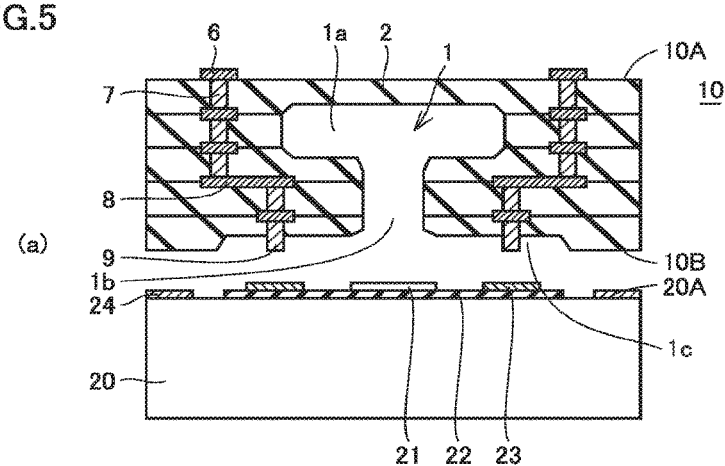
FIG. 5 is a cross sectional view for illustrating a method for manufacturing the module in accordance with the first embodiment.
Figure 5:
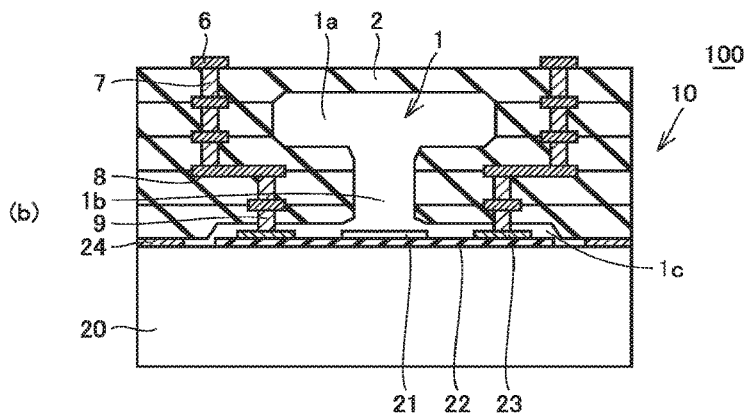

Next, a method for manufacturing module 100 in accordance with the first embodiment will be described with reference to FIG. 5. The method for manufacturing module 100 in accordance with the first embodiment includes a step (S50) of preparing ceramic substrate 10 and device substrate 20, and a step (S60) of bonding ceramic substrate 10 and device substrate 20.

Referring to FIG. 5(a), first, ceramic substrate 10 and device substrate 20 are prepared (step (S50)). Ceramic substrate 10 is prepared according to the method for manufacturing ceramic substrate 10 in accordance with the first embodiment. Device substrate 20 is prepared by forming insulating film 22 on third main surface 20A, and forming electronic component 21, internal electrode 23, and the protective film on insulating film 22, using a common method. Insulating film 22 is formed by thermal oxidation, CVD (Chemical Vapor Deposition), or the like, for example. Internal electrode 23 is formed as a film by sputtering, vapor deposition, or the like, for example. The protective film is formed by CVD or the like, for example.

Next, referring to FIG. 5(b), ceramic substrate 10 and device substrate 20 are bonded (step (S70)). Ceramic substrate 10 and device substrate 20 are arranged such that bonding portion 9 faces internal electrode 23, and thereafter are bonded. As the bonding method on this occasion, any bonding method can be adopted as described above, and these substrates are bonded using adhesive 24, for example.

Bonding is preferably performed in a vacuum at a pressure of less than or equal to 1 kPa, or under a high temperature environment at a temperature of more than or equal to 200° C. and less than or equal to 450° C.

On this occasion, when second main surface 10B of ceramic substrate 10 and a leading end surface of bonding portion 9 exposed within third recessed portion 1c are formed on the same plane, the thickness of adhesive 24 is set to be less than or equal to a total thickness of insulating film 22 and internal electrode 23 in order to allow bonding portion 9 to come into contact with internal electrode 23.

In this manner, module 100 in accordance with the first embodiment can be obtained.

It should be noted that the method of bonding ceramic substrate 10 and device substrate 20 is not limited to the method of bonding them using adhesive 24, and anodic bonding, direct bonding, surface activated bonding, or the like can be adopted.

When anodic bonding is adopted, it is preferable from the viewpoint of improving bonding properties to remove beforehand insulating film 22 and the protective film formed on a region of third main surface 20A of device substrate 20 which faces second main surface 10B of ceramic substrate 10, to expose third main surface 20A of device substrate 20. In addition, in the case of anodic bonding, since a voltage is applied between ceramic substrate 10 and device substrate 20, it is preferable from the viewpoint of preventing a current from flowing into an electric circuit formed on device substrate 20 to bond ceramic substrate 10 and device substrate 20 with a glass substrate or the like being sandwiched therebetween.

Anodic bonding is performed under conditions of a bonding temperature of more than or equal to 350° C. and less than or equal to 450° C., for example, and a bonding voltage of more than or equal to 500 V and less than or equal to 1200 V, for example. Anodic bonding is performed at any pressure which would not cause destruction of ceramic substrate 10, and the pressure is set to more than or equal to 100 kPa and less than or equal to 30 MPa, for example.

When direct bonding is adopted, bonding is performed in a vacuum or under an inert gas atmosphere, because bonding should be performed under a clean atmosphere.

When surface activated bonding is adopted, a bonding surface of ceramic substrate 10 (second main surface 10B) and a bonding surface of device substrate 20 (third main surface 20A, insulating film 22, or the protective film) are irradiated with oxygen plasma, argon plasma, nitrogen plasma or the like to be activated, and thereafter ceramic substrate 10 and device substrate 20 are bonded under a low temperature atmosphere of room temperature to about 400° C., for example.

Figure 6:
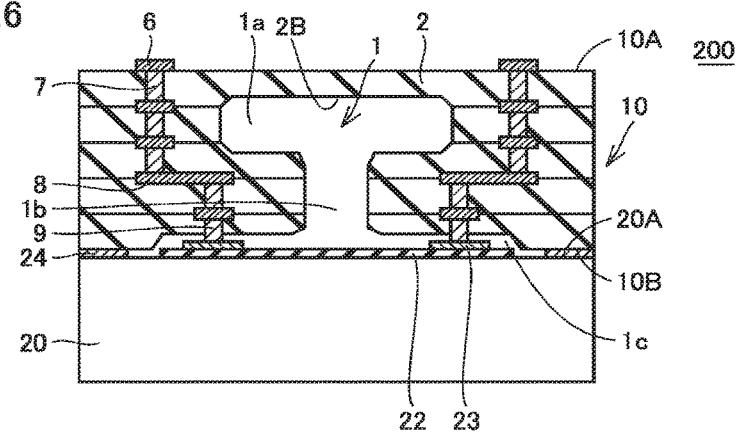
FIG. 6 is a cross sectional view for illustrating a bonded body in accordance with the first embodiment.

Next, bonded body 200 in accordance with the first embodiment will be described with reference to FIG. 6. Bonded body 200 includes ceramic substrate 10 described above, and opposing substrate 20 having third main surface 20A and provided such that an electronic component (electronic component 21 in FIG. 4) can be mounted on third main surface 20A. In ceramic substrate 10 and opposing substrate 20 of bonded body 200, second main surface 10B and third main surface 20A are bonded using adhesive 24.

Although bonded body 200 has basically the same configuration as that of module 100, bonded body 200 is different from module 100 in that bonded body 200 does not include at least electronic component 21, and in that the inside of recessed portion 1 is not airtightly sealed. That is, opposing substrate 20 is different from device substrate 20 in module 100 in that opposing substrate 20 does not include at least electronic component 21 on third main surface 20A.

Ceramic substrate 10 and device substrate 20 in bonded body 200 are bonded by the same method as the method of bonding ceramic substrate 10 and device substrate 20 in module 100.

Bonded body 200 is provided such that electronic component 21 (see FIG. 4) can be arranged from outside into recessed portion 1 and on third main surface 20A of opposing substrate 20. For example, there is formed a transport path (not shown) which connects the inside of recessed portion 1 and the outside of bonded body 200, and through which electronic component 21 can be transported into recessed portion 1. The transport path is provided such that it can be sealed with a sealing member. Bonded body 200 is provided such that electronic component 21 can be arranged from outside into recessed portion 1 through the transport path, and the inside of recessed portion 1 can be airtightly sealed by sealing the transport path with the sealing member after the arrangement. That is, module 100 in accordance with the first embodiment can be easily manufactured not only by the method for manufacturing module 100 in accordance with the first embodiment described above, but also using bonded body 200 in accordance with the first embodiment.

Next, the function and effect of ceramic substrate 10, module 100, and bonded body 200 in accordance with the first embodiment will be described. Ceramic substrate 10 is mainly constituted of ceramic, and has first main surface 10A and second main surface 10B located opposite to first main surface 10A. Recessed portion 1 recessed toward the first main surface 10A side is formed in second main surface 10B. Wire portion 5 extending from the outer peripheral surface of ceramic substrate 10 to the inside of recessed portion 1 is formed, and bottom portion 2 located on the first main surface 10A side in recessed portion 1 has a portion thinner than another portion of ceramic substrate 10 other than bottom portion 2. The thinner portion is provided such that it can form a diaphragm which is deformable when a pressure difference between the pressure inside recessed portion 1 and the outside pressure is provided in a state where airtightness inside recessed portion 1 is maintained (i.e., in an airtight state in module 100).

Thus, when ceramic substrate 10 is bonded to device substrate 20 and the inside of recessed portion 1 is airtightly sealed, the airtight internal space of recessed portion 1 and the external space of ceramic substrate 10 are arranged with bottom portion 2 being interposed therebetween. On this occasion, if a pressure difference is formed between the airtight internal space of recessed portion 1 and the external space of ceramic substrate 10, bottom portion 2 deflects due to the pressure difference when the inside of recessed portion 1 is in an airtight state, because bottom portion 2 has flexibility greater than that of the other portion of ceramic substrate 10 other than bottom portion 2, in particular, that of the other portion other than bottom portion 2 in the portion which faces recessed portion 1. When the airtight state inside recessed portion 1 is broken, the pressure difference between the internal space of recessed portion 1 and the external space of ceramic substrate 10 is cancelled, and deflection of bottom portion 2 is eliminated or changed. That is, with ceramic substrate 10 in accordance with the first embodiment, bottom portion 2 of recessed portion 1 is easily deformable according to the pressure difference between the pressure inside recessed portion 1 when recessed portion 1 is airtightly sealed and the pressure outside ceramic substrate 10. Accordingly, in module 100 in which a power device, a MEMS structural body, or the like is airtightly sealed with ceramic substrate 10, a change in the airtight state can be easily checked from outside as a change in a deflection amount of bottom portion 2 of ceramic substrate 10. As a result, module 100 can be easily inspected for the presence or absence of a defective piece which fails to have the airtight state, not only when module 100 is in the course of the manufacturing process, but also after it is shipped. That is, quality control, reliability verification, and the like of module 100 can be easily performed by using ceramic substrate 10.

Further, recessed portion 1 has stepped portion 3 whose width in the direction along first main surface 10A narrows from the first main surface 10A side toward the second main surface 10B side in the direction intersecting first main surface 10A.

Thus, the width of bottom portion 2 in the direction along first main surface 10A can be set to a length required to check the airtight state in module 100 or more, irrespective of the structure of wire portion 5 and the like. Further, in this case, since the width of second through holes 11H in ceramic base materials 11c, 11d, 11e is set to be narrower than the width of second through hole 11H in ceramic base material 11b in the method for manufacturing ceramic substrate 10, it is possible to limit the amount of an etchant which passes through second through holes 11H in ceramic base materials 11c, 11d, 11e to reach the inside of second through hole 11H in ceramic base material 11b in the step (S30) of forming recessed portion 1. As a result, the etching amount with respect to ceramic base material 11a can be easily controlled, and controllability of the thickness of bottom portion 2 in the direction perpendicular to first main surface 10A can be increased.

Module 100 in accordance with the first embodiment includes ceramic substrate 10 described above, and device substrate 20 having third main surface 20A and including electronic component 21 mounted on third main surface 20A. In ceramic substrate 10 and device substrate 20, second main surface 10B and third main surface 20A are bonded such that electronic component 21 is accommodated within recessed portion 1, and electronic component 21 is airtightly sealed within recessed portion 1.

Accordingly, module 100 in which electronic component 21 such as a power device, a MEMS structural body, or the like is mounted in an airtightly sealed state can be easily inspected for the presence or absence of a defective piece such as electronic component 21 which fails to have the airtight state, as the presence or absence of a change in a deflection degree of bottom portion 2 of ceramic substrate 10. Further, module 100 can also be easily checked for its airtight state even after it is shipped.

Bonded body 200 in accordance with the first embodiment includes ceramic substrate 10 described above, and opposing substrate 20 having third main surface 20A and provided such that an electronic component can be mounted on third main surface 20A. In ceramic substrate 10 and opposing substrate 20, second main surface 10B and third main surface 20A are bonded.

Using such a bonded body 200, module 100 in accordance with the first embodiment can be easily manufactured by mounting electronic component 21 (see FIG. 4) inside recessed portion 1 of ceramic substrate 10, and airtightly sealing the inside of recessed portion 1.

Second Embodiment

Figure 7:
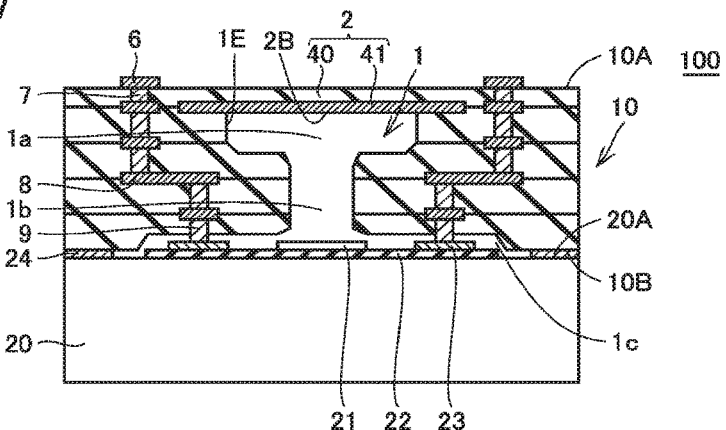
FIG. 7 is a cross sectional view for illustrating a ceramic substrate and a module in accordance with a second embodiment.

Next, ceramic substrate 10, module 100, and bonded body 200 in accordance with a second embodiment will be described with reference to FIG. 7. Although ceramic substrate 10 in accordance with the second embodiment has basically the same configuration as that of ceramic substrate 10 in accordance with the first embodiment, ceramic substrate 10 in accordance with the second embodiment is different from ceramic substrate 10 in accordance with the first embodiment in that bottom portion 2 includes a first protective film 41 constituting inner peripheral surface 2B exposed within recessed portion 1.

Bottom portion 2 is constituted of a protected portion 40 including first main surface 10A, and first protective film 41 including inner peripheral surface 2B. As with bottom portion 2 in the first embodiment, bottom portion 2 entirely has a portion thinner than another portion of ceramic substrate 10 other than bottom portion 2. The thinner portion is provided such that it can form a diaphragm which is deformable when a pressure difference between the pressure inside recessed portion 1 and the outside pressure is provided in a state where airtightness inside recessed portion 1 is maintained (i.e., in an airtight state in module 100).

Although protected portion 40 only needs to have basically the same configuration as that of bottom portion 2 in the first embodiment, protected portion 40 is provided to have a thickness in the direction perpendicular to first main surface 10A which is thinner than that of bottom portion 2 in the first embodiment. Protected portion 40 is not exposed within recessed portion 1, and protected portion 40 does not include inner peripheral surface 2B.

Protected portion 40 is constituted of ceramic serving as the main constituent material for ceramic substrate 10. It should be noted that protected portion 40 may be constituted of a different material which can be etched with a solution capable of etching ceramic serving as the main constituent material for ceramic substrate 10, at a rate more than or equal to the rate of etching the ceramic.

First protective film 41 is formed on a surface of protected portion 40 located opposite to first main surface 10A, and at least a portion thereof is exposed in recessed portion 1 and constitutes inner peripheral surface 2B.

As with protected portion 40, first protective film 41 has flexibility greater than that of the other portion of ceramic substrate 10 other than bottom portion 2. In particular, in a portion of ceramic substrate 10 which faces recessed portion 1, first protective film 41 has flexibility greater than that of the other portion other than bottom portion 2. The thickness of first protective film 41 in the direction perpendicular to first main surface 10A can be set to any thickness as long as bottom portion 2 can have the flexibility described above, and first protective film 41 can remain all over inner peripheral surface 2B and suppress etching on protected portion 40 in a step (S30) of forming recessed portion 1 in a method for manufacturing ceramic substrate 10.

First protective film 41 is constituted of a material having an etching rate lower than that of ceramic substrate 10. That is, first protective film 41 is constituted of a material having an etching rate lower than that of ceramic substrate 10 with respect to at least one of solutions which can etch ceramic serving as the main constituent material for ceramic substrate 10. Further, first protective film 41 has a thickness enough to remain reliably and not to disappear under etching conditions required to form recessed portion 1, and is constituted of a material which has flexibility when it has the thickness. Furthermore, the constituent material for first protective film 41 is preferably the same material as that for external electrode 6 and through via 7, and the most appropriate material is Au, which has resistance to an etchant as described above, has a low conductor resistance, and has a high malleability. Thereby, first protective film 41 can be formed simultaneously with at least one of external electrode 6 and through via 7 in the method for manufacturing ceramic substrate 10.

First protective film 41 has a portion which constitutes inner peripheral surface 2B of recessed portion 1, and a portion which is formed to surround the outer periphery of the former portion and is embedded within ceramic substrate 10 (i.e., a portion located outward in the direction along first main surface 10A, with respect to a side wall 1E formed in recessed portion 1 to extend in a direction intersecting inner peripheral surface 2B). First protective film 41 is formed such that the portion which constitutes inner peripheral surface 2B of recessed portion 1 and the portion which is embedded within ceramic substrate 10 extend in the direction along first main surface 10A. From a different viewpoint, side wall 1E formed in recessed portion 1 to extend in the direction intersecting inner peripheral surface 2B is formed such that its upper end portion located on the first main surface 10A side is connected with first protective film 41.

The planar shape of first protective film 41 in the direction along first main surface 10A may be any shape, and is a square shape, for example.

Although the method for manufacturing ceramic substrate 10 in accordance with the second embodiment has basically the same configuration as that of the method for manufacturing ceramic substrate 10 in accordance with the first embodiment, the method for manufacturing ceramic substrate 10 in accordance with the second embodiment is different from the method for manufacturing ceramic substrate 10 in accordance with the first embodiment in that ceramic base material 11a having first protective film 41 formed thereon is prepared in a step (S10) of preparing a plurality of ceramic base materials.

In the step (S10) of preparing, in ceramic base material 11a, at least one of external electrode 6 and through via 7, and first protective film 41 are formed simultaneously. When through via 7 and first protective film 41 are formed simultaneously, through via 7 is charged into the first through hole from the side of a surface of ceramic base material 11a on which first protective film 41 is formed. First protective film 41 is formed on an exposed portion which will face second through hole 11H when the stacked body is obtained in a step (S20) of firing, and on an outer peripheral portion which surrounds the outer periphery of the exposed portion, in ceramic base material 11a (i.e., a portion of the plurality of ceramic base materials). In the step (S20) of firing, ceramic base materials 11a, 11b, 11c, 11d, 11e are stacked and fired such that first protective film 41 formed on the exposed portion of ceramic base material 11a is exposed within second through hole 11H in ceramic base material 11b, and the outer peripheral portion of ceramic base material 11a is connected with a peripheral portion adjacent to second through hole 11H in ceramic base material 11b (i.e., a remaining ceramic base material), with first protective film 41 being sandwiched therebetween.

Further, in the step (S30) of forming recessed portion 1, the portion which faces recessed portion 1 is exposed to a solution capable of etching ceramic serving as the main constituent material for ceramic substrate 10. Since inner peripheral surface 2B of bottom portion 2 is constituted of first protective film 41 in the portion which faces recessed portion 1, bottom portion 2 (protected portion 40 and first protective film 41) is not etched. Accordingly, the thickness of bottom portion 2 in the direction perpendicular to first main surface 10A is suppressed from being reduced in this step (S30).

It should be noted that side wall 1E in the recessed portion 1 is exposed to an etchant in this step (S30). Accordingly, side wall 1E is etched to be gradually moved outward in the direction along first main surface 10A as etching time progresses, and thus etching is finished when side wall 1E is within a range in which it underlies first protective film 41 in the direction perpendicular to first main surface 10A.

Also with such a configuration, bottom portion 2 in the second embodiment as a whole has the same flexibility as that of bottom portion 2 in the first embodiment, and accordingly, ceramic substrate 10, module 100, and bonded body 200 in accordance with the second embodiment can exhibit the same effects as those of ceramic substrate 10, module 100, and bonded body 200 in accordance with the first embodiment, respectively.

Further, bottom portion 2 in the second embodiment includes first protective film 41 constituting inner peripheral surface 2B exposed within recessed portion 1, and first protective film 41 is constituted of a material having an etching rate lower than that of ceramic substrate 10.

Accordingly, in the second embodiment, the thickness of bottom portion 2 in the direction perpendicular to first main surface 10A can be determined by process conditions having controllability higher than that of the etching conditions in the step (S30) of forming recessed portion 1 in the method for manufacturing ceramic substrate 10 (for example, formation conditions, polishing conditions, and the like for ceramic base material 11a), and thus bottom portion 2 can be formed with accuracy. As a result, in module 100 in accordance with the second embodiment, a change in the airtight state can be checked with high accuracy, based on bottom portion 2 of ceramic substrate 10.

Third Embodiment

Figure 8:
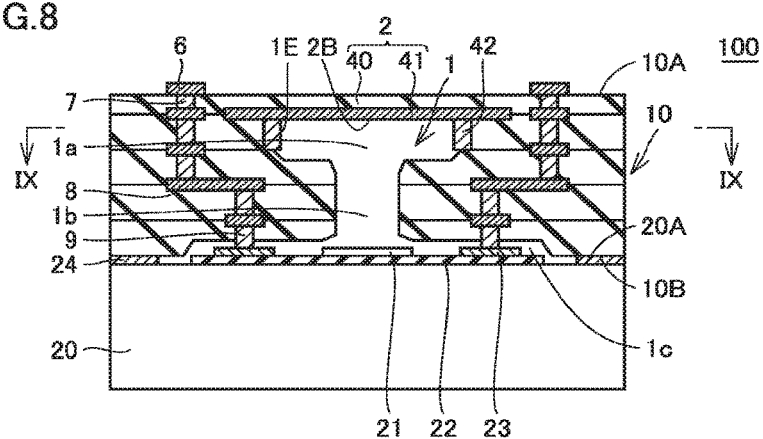
FIG. 8 is a cross sectional view for illustrating a ceramic substrate and a module in accordance with a third embodiment.
Figure 9:
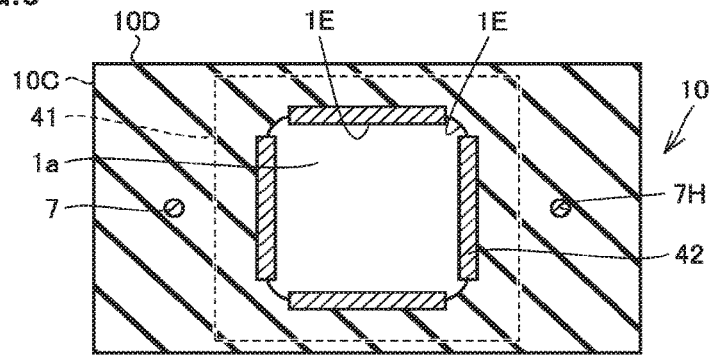
FIG. 9 is a cross sectional view seen from a line segment IX-IX in FIG. 8.
Figure 10:
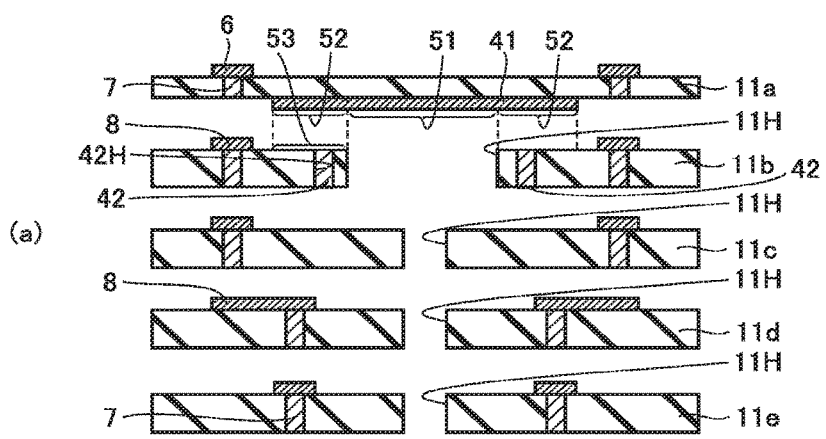
FIG. 10 is a cross sectional view for illustrating a method for manufacturing the ceramic substrate in accordance with the third embodiment.
Figure 10:
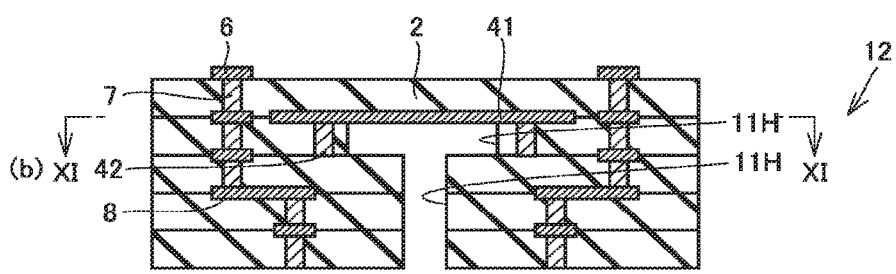
Figure 11:
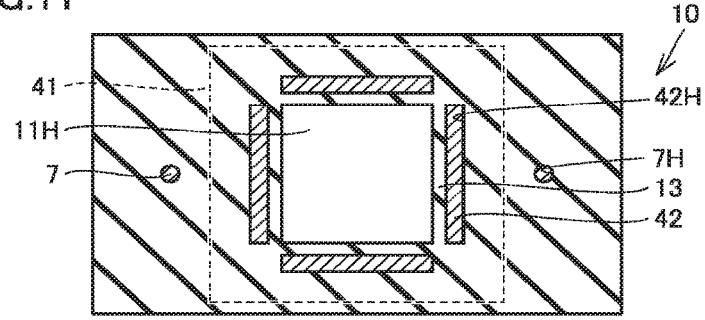
FIG. 11 is a cross sectional view for illustrating the method for manufacturing the ceramic substrate in accordance with the third embodiment, showing the state of a stacked body prior to a step (S30) of forming a recessed portion in the same cross section as that in the cross sectional view shown in FIG. 9.

Next, ceramic substrate 10, module 100, and bonded body 200 in accordance with a third embodiment will be described with reference to FIGS. 8 to 11. FIG. 8 is a cross sectional view for illustrating ceramic substrate 10 and module 100 in accordance with the third embodiment, and FIG. 9 is a cross sectional view seen from a line segment IX-IX in FIG. 8. FIG. 10(a) is a cross sectional view for illustrating a step (S10) of preparing in a method for manufacturing the ceramic substrate in accordance with the third embodiment. FIG. 10(b) is a cross sectional view for illustrating a stacked body obtained by a step (S20) of firing in the method for manufacturing the ceramic substrate in accordance with the third embodiment. FIG. 11 is a cross sectional view showing a state prior to a step (S30) of forming recessed portion 1 in the same cross section as that in the cross sectional view shown in FIG. 9, and is a cross sectional view seen from a line segment XI-XI in FIG. 10(b).

Although ceramic substrate 10 in accordance with the third embodiment has basically the same configuration as that of ceramic substrate 10 in accordance with the second embodiment, ceramic substrate 10 in accordance with the third embodiment is different from ceramic substrate 10 in accordance with the second embodiment in that ceramic substrate 10 includes a second protective film 42 connected with an outer peripheral portion of inner peripheral surface 2B of bottom portion 2, and constituting a portion of side wall 1E of recessed portion 1, within recessed portion 1.

Second protective film 42 is constituted of a material having an etching rate lower than that of ceramic substrate 10. That is, second protective film 42 is constituted of a material having an etching rate lower than that of ceramic substrate 10 with respect to at least one of solutions which can etch ceramic serving as the main constituent material for ceramic substrate 10. As with the material constituting first protective film 41, the material constituting second protective film 42 is preferably Au, which has a low conductor resistance and has malleability.

Further, second protective film 42 is provided such that its thickness in the direction along first main surface 10A is enough for second protective film 42 to remain reliably and not to disappear under etching conditions required to form recessed portion 1.

Second protective film 42 is connected with the outer peripheral portion of inner peripheral surface 2B of bottom portion 2, and constitutes a portion of side wall 1E of recessed portion 1. In other words, second protective film 42 has an upper end portion located on the first main surface 10A side, and the upper end portion is connected with a portion located inward from the portion embedded within ceramic substrate 10 in first protective film 41.

Further, referring to FIGS. 9 and 11, second protective film 42 is constituted of four linear-shaped portions which overlap with respective sides of a square, for example, and are not formed to be connected and are separated from each other at corners of the square, on a plane parallel to first main surface 10A. In other words, second protective film 42 is provided to partially overlap with side wall 1E of recessed portion 1 (in other words, to partially surround the periphery of second through hole 11H in ceramic base material 11b).

It should be noted that second protective film 42 may be constituted of, for example, a plurality of arc-shaped portions which overlap with respective portions of a circle and are separated from each other, or may be constituted of n linear-shaped portions which overlap with respective n sides of a polygon, where n represents any number, and are not formed to be connected and are separated from each other at corners of the polygon.

Next, the method for manufacturing ceramic substrate 10 in accordance with the third embodiment will be described with reference to FIGS. 8 to 11. Although the method for manufacturing ceramic substrate 10 in accordance with the third embodiment has basically the same configuration as that of the method for manufacturing ceramic substrate 10 in accordance with the second embodiment, the method for manufacturing ceramic substrate 10 in accordance with the third embodiment is different from the method for manufacturing ceramic substrate 10 in accordance with the second embodiment in that ceramic base material 11b having second protective film 42 formed around second through hole 11H is prepared in the step (S10) of preparing a plurality of ceramic base materials (see FIG. 10(a)).

In the step (S10) of preparing, second protective film 42 can be formed on ceramic base material 11b simultaneously with through via 7. Specifically, first, first through hole 7H in which through via 7 is to be formed, and a third through hole 42H in which second protective film 42 is to be formed, are formed in ceramic base material 11b. Third through hole 42H is formed to partially surround the periphery of second through hole 11H in ceramic base material 11b. Thereafter, through via 7 and second protective film 42 are formed by charging a material constituting through via 7 and a material constituting second protective film 42 into first through hole 7H and third through hole 42H, respectively.

Furthermore, in the step (S10), second through hole 11H is formed in a region surrounded by second protective film 42. In other words, in the step (S10), second through hole 11H and a portion therearound which is to be etched in the later step (S30) (i.e., a sacrificial etching portion 13) are formed in a region of ceramic base material 11b surrounded by second protective film 42. In the step (S10), first protective film 41 is formed on an exposed portion 51 (see FIG. 10(a)) which will face second through hole 11H when the stacked body is obtained in the step (S20) of firing, and on an outer peripheral portion 52 which surrounds the outer periphery of exposed portion 51, in ceramic base material 11a (i.e., a portion of the plurality of ceramic base materials).

Next, in the step (S20) of firing, ceramic base materials 11a, 11b, 11c, 11d, 11e are stacked and fired such that first protective film 41 formed on exposed portion 51 of ceramic base material 11a is exposed within second through hole 11H in ceramic base material 11b, and outer peripheral portion 52 of ceramic base material 11a is connected with a peripheral portion 53 adjacent to second through hole 11H in ceramic base material 11b (i.e., a remaining ceramic base material), with first protective film 41 being sandwiched therebetween. Thereby, stacked body 12 having first protective film 41 and second protective film 42 connected with each other, and having cross sectional shapes as shown in FIGS. 10(*b*) and 11 is formed.

Sacrificial etching portion 13 is etched by performing the step (S30) of forming recessed portion 1 on stacked body 12. As a result, as shown in FIG. 9, a portion of side wall 1E of recessed portion 1 is formed on second protective film 42, and another portion of side wall 1E of recessed portion 1 is formed on ceramic substrate 10 located between adjacent second protective films 42 to connect adjacent second protective films 42. In this case, in the plane parallel to first main surface 10A, each corner of the cross sectional shape of recessed portion 1 is formed between adjacent second protective films 42. In this manner, ceramic substrate 10 in accordance with the third embodiment can be obtained.

Since bottom portion 2 in the third embodiment as a whole has the same flexibility as that of bottom portion 2 in the first embodiment, ceramic substrate 10, module 100, and bonded body 200 in accordance with the third embodiment can exhibit the same effects as those of ceramic substrate 10, module 100, and bonded body 200 in accordance with the first embodiment.

Furthermore, ceramic substrate 10 includes second protective film 42 connected with the outer peripheral portion of inner peripheral surface 2B of bottom portion 2, and constituting a portion of side wall 1E of recessed portion 1, within recessed portion 1, and second protective film 42 is constituted of a material having an etching rate lower than that of ceramic substrate 10.

Therefore, second protective film 42 suppresses excessive etching of ceramic substrate 10 in the direction along first main surface 10A in the step (S30) of forming recessed portion 1, and recessed portion 1 is formed such that second protective film 42 constitutes a portion of side wall 1E. That is, in ceramic substrate 10 in accordance with the third embodiment, the position at which side wall 1E of recessed portion 1 is formed is fixed by second protective film 42, and thereby variation in the area of bottom portion 2 in the direction along first main surface 10A is suppressed, irrespective of etching time and the like. As a result, in module 100 in accordance with the third embodiment, variation between individual pieces is suppressed in terms of accuracy with which a change in the airtight state can be checked based on bottom portion 2. Accordingly, in module 100 in accordance with the third embodiment, a change in the airtight state can be checked with high accuracy.

It should be noted that second protective film 42 may be provided to overlap with entire side wall 1E of recessed portion 1 (in other words, to surround the entire periphery of second through hole 11H in ceramic base material 11*b*).

Fourth Embodiment

Next, ceramic substrate 10 in accordance with a fourth embodiment will be described with reference to FIGS. 12 to 14. Although ceramic substrate 10 in accordance with the fourth embodiment has basically the same configuration as that of ceramic substrate 10 in accordance with the third embodiment, ceramic substrate 10 in accordance with the fourth embodiment is different from ceramic substrate 10 in accordance with the third embodiment in that ceramic substrate 10 includes a third protective film 43 arranged within recessed portion 1 to be spaced from first protective film 41.

Third protective film 43 is arranged within recessed portion 1 to be spaced from first protective film 41. Third protective film 43 is formed on stepped portion 3.

Figure 12:
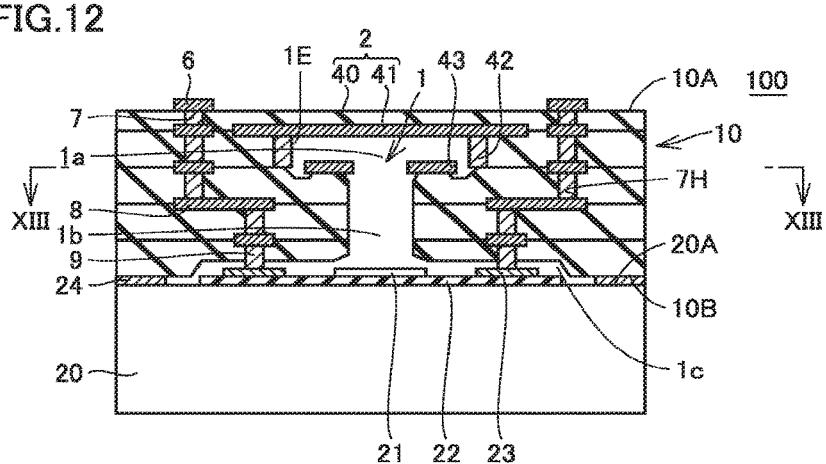
FIG. 12 is a cross sectional view for illustrating a ceramic substrate and a module in accordance with a fourth embodiment.
Figure 13:
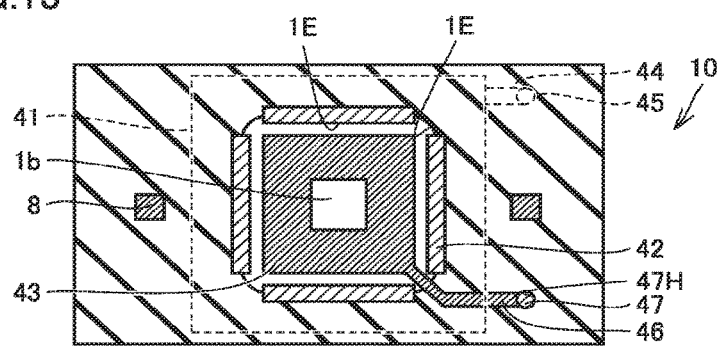
FIG. 13 is a cross sectional view seen from a line segment XIII-XIII in FIG. 12.
Figure 14:
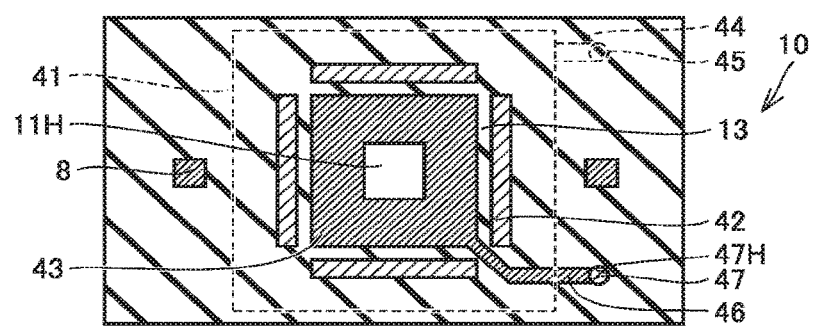
FIG. 14 is a cross sectional view for illustrating a method for manufacturing the ceramic substrate in accordance with the fourth embodiment, showing the state of a stacked body prior to a step (S30) of forming a recessed portion in the same cross section as that in the cross sectional view shown in FIG. 13.

FIG. 13 shows a cross sectional view seen from a line segment XIII-XIII in FIG. 12. FIG. 14 is a cross sectional view showing a state prior to a step (S30) of forming recessed portion 1 in the same cross section as that in the cross sectional view shown in FIG. 13.

In third protective film 43, a through hole is formed in a region which overlaps with second recessed portion 1*b*. In other words, third protective film 43 is formed in an annular shape to surround the entire periphery of second recessed portion 1*b*.

First protective film 41 has a square planar shape, for example, in the direction along first main surface 10A. Third protective film 43 has a square outer shape, for example, and has a square through hole formed at the central portion thereof, in the direction along first main surface 10A. It should be noted that the planar shapes of first protective film 41 and third protective film 43 are not limited thereto, and may be any shape such as a circular shape, a polygonal shape, or the like.

Third protective film 43 may be provided to partially overlap with second recessed portion 1*b* in the direction perpendicular to first main surface 10A. It should be noted that third protective film 43 may be provided not to overlap with second recessed portion 1*b* in the direction perpendicular to first main surface 10A.

First recessed portion 1*a* and second recessed portion 1*b* are connected via the through hole, and are not blocked by third protective film 43.

First protective film 41 and third protective film 43 have electrical conductivity. Third protective film 43 is not connected with first protective film 41 and second protective film 42, and is provided to be spaced therefrom in the direction perpendicular to first main surface 10A and in the direction along first main surface 10A.

Third protective film 43 is constituted of a material having an etching rate lower than that of ceramic substrate 10, as with the materials constituting first protective film 41 and second protective film 42. That is, third protective film 43 is constituted of a material having an etching rate lower than that of ceramic substrate 10 with respect to at least one of solutions which can etch ceramic serving as the main constituent material for ceramic substrate 10.

First protective film 41 is electrically connected with a first electrode 45 via a connection electrode 44. Connection electrode 44 is formed on a plane parallel to first main surface 10A to be connected with first protective film 41. First electrode 45 is formed to extend in the direction perpendicular to first main surface 10A, and is provided such that its end portion located on the second main surface 10B side is connected with connection electrode 44, and its end portion located on the first main surface 10A side is exposed on first main surface 10A.

Third protective film 43 is electrically connected with a second electrode 47 via a connection electrode 46. Connection electrode 46 is formed on a plane parallel to first main surface 10A to be connected with third protective film 43. Second electrode 47 is formed to extend in the direction perpendicular to first main surface 10A, and is provided such that its end portion located on the second main surface 10B side is connected with connection electrode 46, and its end portion located on the first main surface 10A side is exposed on first main surface 10A. Connection electrode 44 and first electrode 45 are not electrically connected with connection electrode 46 and second electrode 47.

Next, a method for manufacturing ceramic substrate 10 in accordance with the fourth embodiment will be described. Although the method for manufacturing ceramic substrate 10 in accordance with the fourth embodiment has basically the same configuration as that of the method for manufacturing ceramic substrate 10 in accordance with the third embodiment, the method for manufacturing ceramic substrate 10 in accordance with the fourth embodiment is different from the method for manufacturing ceramic substrate 10 in accordance with the third embodiment in that ceramic base material 11c having third protective film 43 formed around second through hole 11H and connection electrode 46 and second electrode 47 electrically connected with third protective film 43 is prepared in a step (S10) of preparing a plurality of ceramic base materials.

In the step (S10) of preparing, third protective film 43 can be formed on ceramic base material 11c simultaneously with through via 7, horizontal wire 8, connection electrode 46, and second electrode 47. Specifically, first, first through hole 7H in which through via 7 is to be formed, and a fourth through hole 47H in which second electrode 47 is to be formed, are formed in ceramic base material 11c Thereafter, the material constituting through via 7 and a material constituting second electrode 47 are charged into first through hole 7H and fourth through hole 47H, respectively, and horizontal wire 8 and third protective film 43 are formed on a surface of ceramic base material 11c. Thereby, ceramic base material 11c having through via 7, horizontal wire 8, third protective film 43, connection electrode 46, and second electrode 47 formed therein is prepared.

Furthermore, in ceramic base material 11a prepared in this step (S10), connection electrode 44, first electrode 45, and second electrode 47 are further formed in addition to through via 7 and first protective film 41. Through via 7, first protective film 41, connection electrode 44, first electrode 45, and second electrode 47 can be formed simultaneously. Also in this case, as with the method for manufacturing ceramic substrate 10 in accordance with the second embodiment, the material constituting through via 7 and the material constituting second electrode 47 are charged into first through hole 7H and fourth through hole 47H, respectively, from the side of a surface of ceramic base material 11a on which first protective film 41 is formed. Furthermore, in ceramic base material 11b prepared in this step (S10), second electrode 47 is further formed in addition to through via 7 and second protective film 42.

Next, by a step (S20) of firing the plurality of ceramic base materials, second electrodes 47 formed in ceramic base materials 11a, 11b, 11c are connected, and third protective film 43, connection electrode 46, and second electrodes 47 are electrically connected. Thereby, stacked body 12 having a cross sectional shape as shown in FIG. 14 is formed.

Sacrificial etching portion 13 is etched by performing the step (S30) of forming recessed portion 1 on stacked body 12. On this occasion, first protective film 41, second protective film 42, and third protective film 43 remain. As a result, as shown in FIGS. 12 and 13, third protective film 43 arranged within recessed portion 1 to be spaced from each of first protective film 41 and second protective film 42 is formed. In this manner, ceramic substrate 10 in accordance with the fourth embodiment can be obtained.

Since bottom portion 2 in the fourth embodiment as a whole has the same flexibility as that of bottom portion 2 in the first embodiment, ceramic substrate 10, module 100, and bonded body 200 in accordance with the fourth embodiment can exhibit the same effects as those of ceramic substrate 10, module 100, and bonded body 200 in accordance with the first embodiment.

Furthermore, ceramic substrate 10 includes third protective film 43 arranged within recessed portion 1 to be spaced from first protective film 41, first protective film 41 and third protective film 43 have electrical conductivity, and first electrode 45 and second electrode 47 electrically connected with first protective film 41 and third protective film 43, respectively, are formed in the outer peripheral surface of ceramic substrate 10.

Accordingly, in ceramic substrate 10, a change in the deflection amount of bottom portion 2 can be measured as a change in electrostatic capacity between first protective film 41 and third protective film 43. As a result, with ceramic substrate 10 in accordance with the fourth embodiment, a change in the airtight state in module 100 in which a power device, a MEMS structural body, or the like is airtightly sealed can be sensed with accuracy as a change in electrostatic capacity between first protective film 41 and third protective film 43.

It should be noted that, in the fourth embodiment, second protective film 42 does not have to be formed. That is, ceramic substrate 10 in accordance with the fourth embodiment may have a configuration that third protective film 43 described above is formed in ceramic substrate 10 in accordance with the second embodiment. Also with such a configuration, the same effect as that of ceramic substrate 10 in accordance with the fourth embodiment can be exhibited.

Fifth Embodiment

Figure 15:
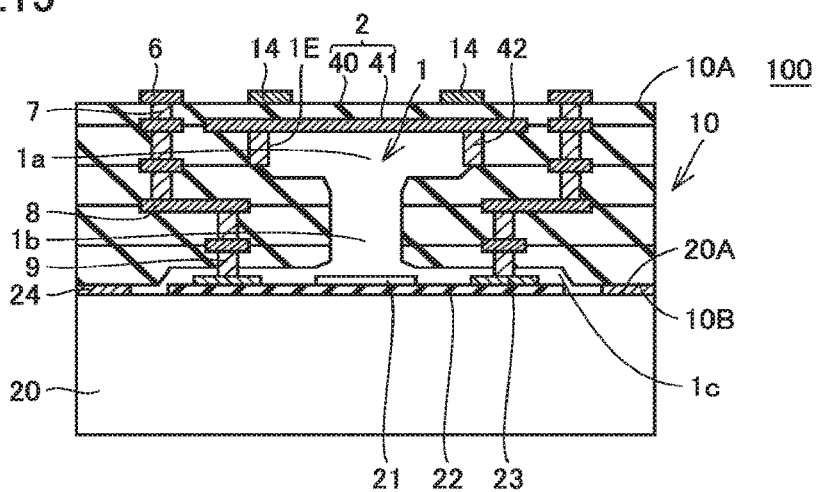
FIG. 15 is a cross sectional view for illustrating a ceramic substrate and a module in accordance with a fifth embodiment.

Next, ceramic substrate 10, module 100, and bonded body 200 in accordance with a fifth embodiment will be described with reference to FIG. 15. Although ceramic substrate 10 in accordance with the fifth embodiment has basically the same configuration as that of ceramic substrate 10 in accordance with the second embodiment, ceramic substrate 10 in accordance with the fifth embodiment is different from ceramic substrate 10 in accordance with the second embodiment in that ceramic substrate 10 includes a strain gauge 14 arranged on first main surface 10A at bottom portion 2.

That is, since bottom portion 2 in the fifth embodiment as a whole has the same flexibility as that of bottom portion 2 in the first embodiment, ceramic substrate 10, module 100, and bonded body 200 in accordance with the fifth embodiment can exhibit the same effects as those of ceramic substrate 10, module 100, and bonded body 200 in accordance with the first embodiment.

Furthermore, strain gauge 14 is arranged on first main surface 10A at bottom portion 2. Bottom portion 2 in the fifth embodiment has the same configuration as that of bottom portion 2 in the second embodiment, and a deflection amount of bottom portion 2 changes due to a change in the airtight state inside recessed portion 1 in module 100. On this occasion, the change in the deflection amount of bottom portion 2 can be sensed as a change in output value (resistance value) of strain gauge 14.

Accordingly, with ceramic substrate 10 in accordance with the fifth embodiment, a change in the airtight state in module 100 in which a power device, a MEMS structural body, or the like is airtightly sealed can be sensed with accuracy as a change in output value of strain gauge 14.

It should be noted that strain gauge 14 may have any configuration. For example, strain gauge 14 may be a metal strain gauge constituted of a Cu—Ni alloy, a Ni—Cr alloy, or the like with a high gauge factor which is formed as a film, or may be a semiconductor strain gauge constituted of a semiconductor material such as p-type or n-type silicon which is formed as a film.

It should be noted that strain gauge 14 can be formed on first main surface 10A at bottom portion 2 by any method. For example, strain gauge 14 is formed by forming a film of the metal material or the semiconductor material described above on first main surface 10A by sputtering or the like after the step (S30) of forming recessed portion 1.

Further, when ceramic substrate 10 is provided such that it can be anodically bonded to Si, bottom portion 2 may be constituted, for example, as a portion of a Si wafer or an SOI wafer anodically bonded on ceramic base material 11b of an LTCC multilayer substrate formed by firing ceramic base materials 11b, 11c, 11d, 11e described above. Thereby, the change in the airtight state inside recessed portion 1 in module 100 can be sensed with high accuracy as a change in output value (resistance value) of strain gauge 14.

It should be noted that, in the fifth embodiment, first protective film 41 and second protective film 42 do not have to be formed, and first protective film 41 and third protective film 43 may be formed. That is, ceramic substrate 10 in accordance with the fifth embodiment may have a configuration that strain gauge 14 described above is formed in any of ceramic substrates 10 in accordance with the first to fourth embodiments. Also with such a configuration, the same effect as that of ceramic substrate 10 in accordance with the fifth embodiment can be exhibited.

It should be noted that, although a plurality of lines parallel to first main surface 10A are shown inside ceramic substrate 10 in the drawings, these lines indicate boundaries between the plurality of ceramic base materials 11a, 11b, 11c, 11d, 11e for convenience of description of the embodiments, and are not found in actual ceramic substrate 10, module 100, and bonded body 200. Further, deflection of bottom portion 2 in module 100 is not shown in the drawings. The deflection amount and the deflection shape of bottom portion 2 vary depending on the pressure difference between the inside of recessed portion 1 and the outside of module 100, and the like.

Although the embodiments of the present invention have been described above, it should be understood that the embodiments disclosed herein are illustrative and non-restrictive in every respect. The scope of the present invention is defined by the scope of the claims, and is intended to include any modifications within the scope and meaning equivalent to the scope of the claims.

INDUSTRIAL APPLICABILITY

The present invention is particularly advantageously applicable to a ceramic substrate for forming a module in which a power device, a MEMS structural body, or the like is airtightly sealed, a bonded body including the ceramic substrate, and a module in which a power device, a MEMS structural body, or the like is airtightly sealed using the ceramic substrate.

REFERENCE SIGNS LIST

1: recessed portion; 1E: side wall; 1a: first recessed portion; 1b: second recessed portion; 1c: third recessed portion; 2: bottom portion; 2B: inner peripheral surface; 3, 4: stepped portion; 5: wire portion; 6: external electrode; 7: through via; 7H: first through hole; 8: horizontal wire; 9: bonding portion; 10: ceramic substrate; 10A: first main surface; 10B: second main surface; 10C, 10D: side surface; 11H: second through hole; 11a, 11b, 11c, 11d, 11e: ceramic base material; 12: stacked body; 13: sacrificial etching portion; 14: strain gauge; 20: device substrate, opposing substrate; 20A: third main surface; 21: electronic component; 22: insulating film; 23: internal electrode; 24: adhesive; 40: protected portion; 41: first protective film; 42: second protective film; 42H: third through hole; 43: third protective film; 44, 46: connection electrode; 45: first electrode; 47: second electrode; 47H: fourth through hole; 100: module; 200: bonded body.

The invention claimed is:

1. A ceramic substrate mainly constituted of ceramic and having a first main surface and a second main surface located opposite to the first main surface, wherein
   a recessed portion recessed toward a first main surface side is formed in the second main surface,
   a wire portion extending from an outer peripheral surface of the ceramic substrate to inside of the recessed portion is formed,
   a bottom portion located on the first main surface side in the recessed portion has a diaphragm which is a portion thinner than another portion of the ceramic substrate other than the bottom portion,
   the diaphragm is configured to have flexibility to deform when the inside of the recessed portion is airtightly sealed and a pressure difference is formed between the airtightly sealed inside of the recessed portion and an external space of the ceramic substrate,
   the recessed portion includes
      a first recessed portion which faces the bottom portion and has a first width in a direction along the first main surface,
      a second recessed portion which is connected with the first recessed portion on a second main surface side in a direction perpendicular to the first main surface, and has a second width in the direction along the first main surface, and
      a third recessed portion which is connected with the second recessed portion on the second main surface side in the direction perpendicular to the first main surface, and has a third width in the direction along the first main surface, and the first width and the third width are both greater than the second width.

2. The ceramic substrate according to claim 1, comprising a strain gauge arranged on the first main surface at the bottom portion.

3. The ceramic substrate according to claim 1, wherein a portion of the bottom portion constituting a portion of the first main surface is made of silicon.

4. The ceramic substrate according to claim 1, wherein the ceramic substrate is a low temperature co-fired ceramic multilayer substrate.

5. A module, comprising:
   the ceramic substrate according to claim 1; and
   a device substrate having a third main surface and including an electronic component mounted on the third main surface, wherein
   in the ceramic substrate and the device substrate, the second main surface and the third main surface are bonded such that the electronic component is accommodated within the recessed portion, and
   the electronic component is airtightly sealed within the recessed portion.

6. The ceramic substrate according to claim 1, wherein the third width is greater than the first width.

7. A ceramic substrate mainly constituted of ceramic and having a first main surface and a second main surface located opposite to the first main surface, wherein
   a recessed portion recessed toward a first main surface side is formed in the second main surface,
   a wire portion extending from an outer peripheral surface of the ceramic substrate to inside of the recessed portion is formed,
   a bottom portion located on the first main surface side in the recessed portion has a diaphragm which is a portion thinner than another portion of the ceramic substrate other than the bottom portion,
   the diaphragm is configured to have flexibility to deform when the inside of the recessed portion is airtightly sealed and a pressure difference is formed between the airtightly sealed inside of the recessed portion and an external space of the ceramic substrate,
   the bottom portion includes a first protective film constituting an inner peripheral surface exposed within the recessed portion,
   the first protective film is constituted of a material having an etching rate lower than that of the ceramic substrate,
   the ceramic substrate comprises a second protective film connected with an outer peripheral portion of the inner peripheral surface of the bottom portion and constoituting a portion of a side wall of the recessed portion, within the recessed portion, and
   the second protective film is constituted of a material having an etching rate lower than that of the ceramic substrate.

8. The ceramic substrate according to claim 7, wherein
   the first protective film has a portion embedded within the ceramic substrate,
   the second protective film has an upper end portion located on the first main surface side, and
   the upper end portion of the second protective film is connected with a portion located inward from the portion embedded within the ceramic substrate in the first protective film.

9. The ceramic substrate according to claim 7, comprising a third protective film arranged within the recessed portion to be spaced from the first protective film, wherein
   the first protective film and the third protective film have electrical conductivity, and
   a first electrode and a second electrode electrically connected with the first protective film and the third protective film, respectively, are formed in the outer peripheral surface of the ceramic substrate.

* * * * *